(12) United States Patent
Tokunaga et al.

(10) Patent No.: US 6,388,728 B1
(45) Date of Patent: *May 14, 2002

(54) ELECTRODE PLATE, PROCESS FOR PRODUCING THE PLATE, LIQUID CRYSTAL DEVICE INCLUDING SAME AND PROCESS FOR PRODUCING THE DEVICE

(75) Inventors: Hiroyuki Tokunaga, Fujisawa; Masaru Kamio, Sagamihara; Haruo Tomono; Yuji Matsuo, both of Machida, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/855,567

(22) Filed: May 13, 1997

(30) Foreign Application Priority Data

May 14, 1996  (JP) ................................................ 8-119392

(51) Int. Cl.[7] ....................... G02F 1/1333; G02F 1/1339
(52) U.S. Cl. ....................................... 349/158; 349/153
(58) Field of Search ................................. 349/148, 149, 349/190, 189, 153, 155, 158, 147

(56) References Cited

U.S. PATENT DOCUMENTS

| | | | | |
|---|---|---|---|---|
| RE28,891 E | * | 7/1976 | Borel et al. | 349/153 |
| 5,033,824 A | * | 7/1991 | Bohmer | 349/155 |
| 5,193,021 A | * | 3/1993 | Kim | 349/148 |
| 5,212,575 A | * | 5/1993 | Kojima et al. | 349/148 |
| 5,504,601 A | * | 4/1996 | Watanable et al. | 359/59 |
| 5,777,710 A | * | 7/1998 | Okada et al. | 349/148 |
| 5,838,409 A | * | 11/1998 | Tomono et al. | 349/148 |
| 5,905,558 A | * | 5/1999 | Tokunaga et al. | 349/190 |

* cited by examiner

Primary Examiner—William L. Sikes
Assistant Examiner—Dung Nguyen
(74) Attorney, Agent, or Firm—Fitzpatrick, Cella, Harper & Scinto

(57) ABSTRACT

An electrode plate is constituted by a substrate, a plurality of metal electrodes formed with gaps therebetween in a prescribed pattern on the substrate, and a resin filling the gaps. The substrate is provided with an elongated projection disposed in a peripheral region thereof. The elongated projection formed on the substrate is effective in preventing the resin from flowing out from the sides of the substrate, thus suppressing an insufficient filling portion in the gaps between the metal electrode to provide a uniform and smooth surface of the resin and the metal electrode in combination.

15 Claims, 20 Drawing Sheets

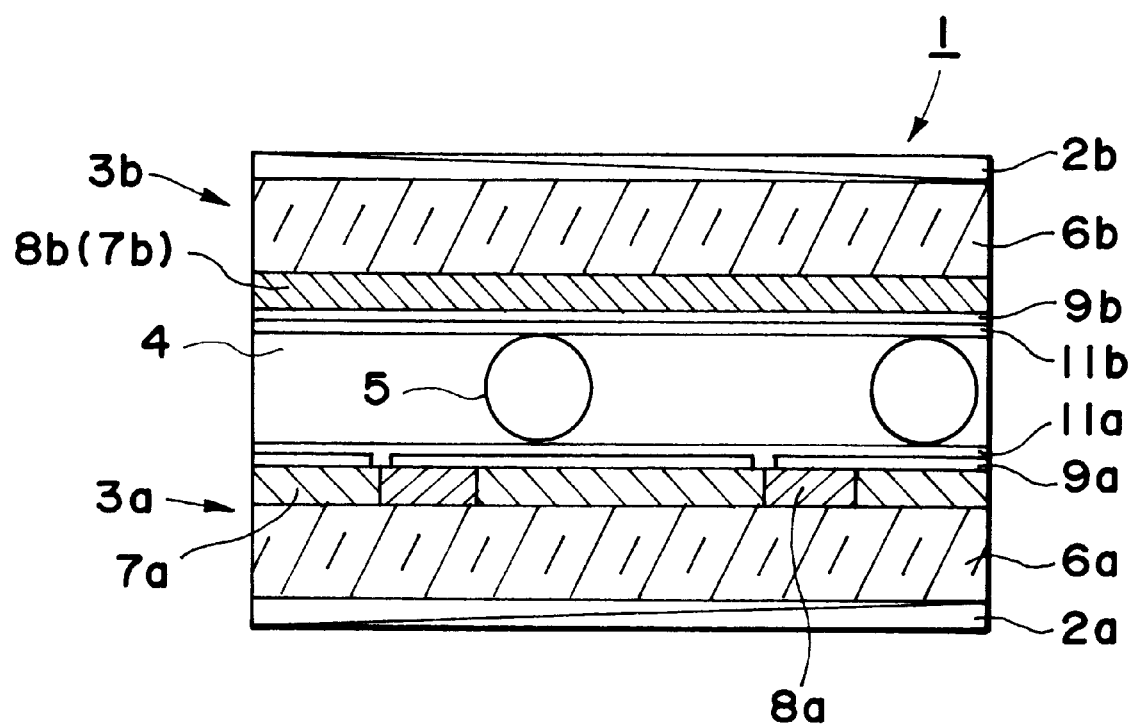
F I G. 1

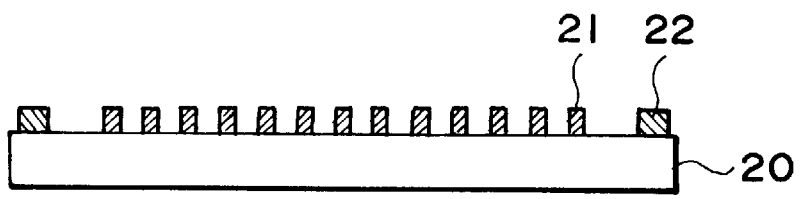
F I G. 11
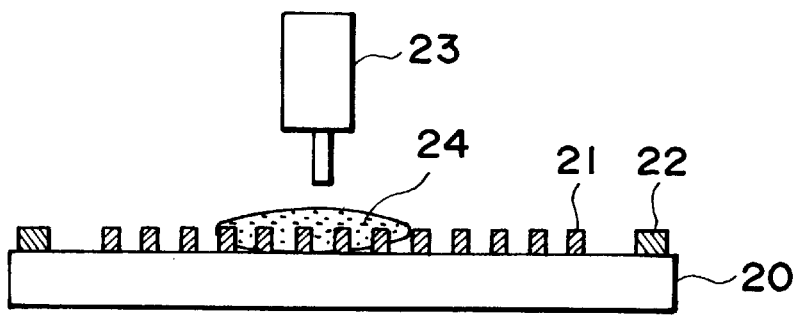
F I G. 12A
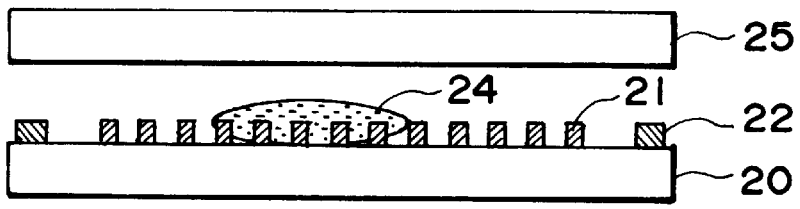
F I G. 12B
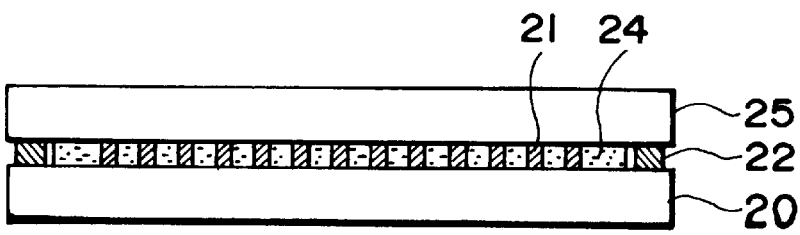
F I G. 12C

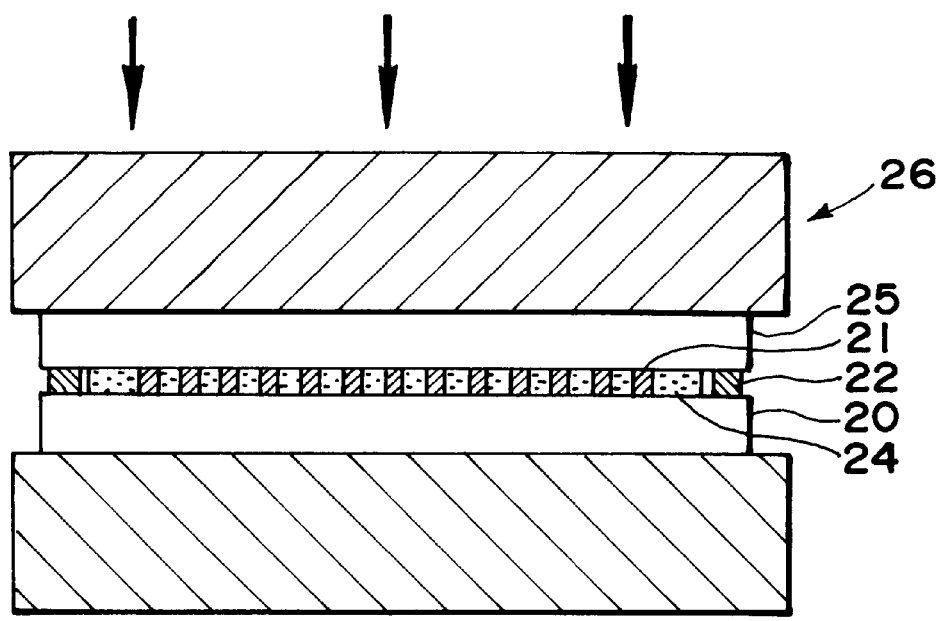
F I G. 13
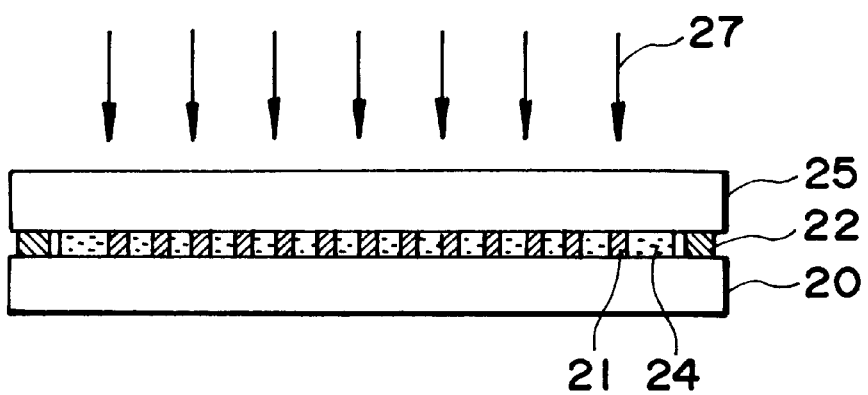
F I G. 14

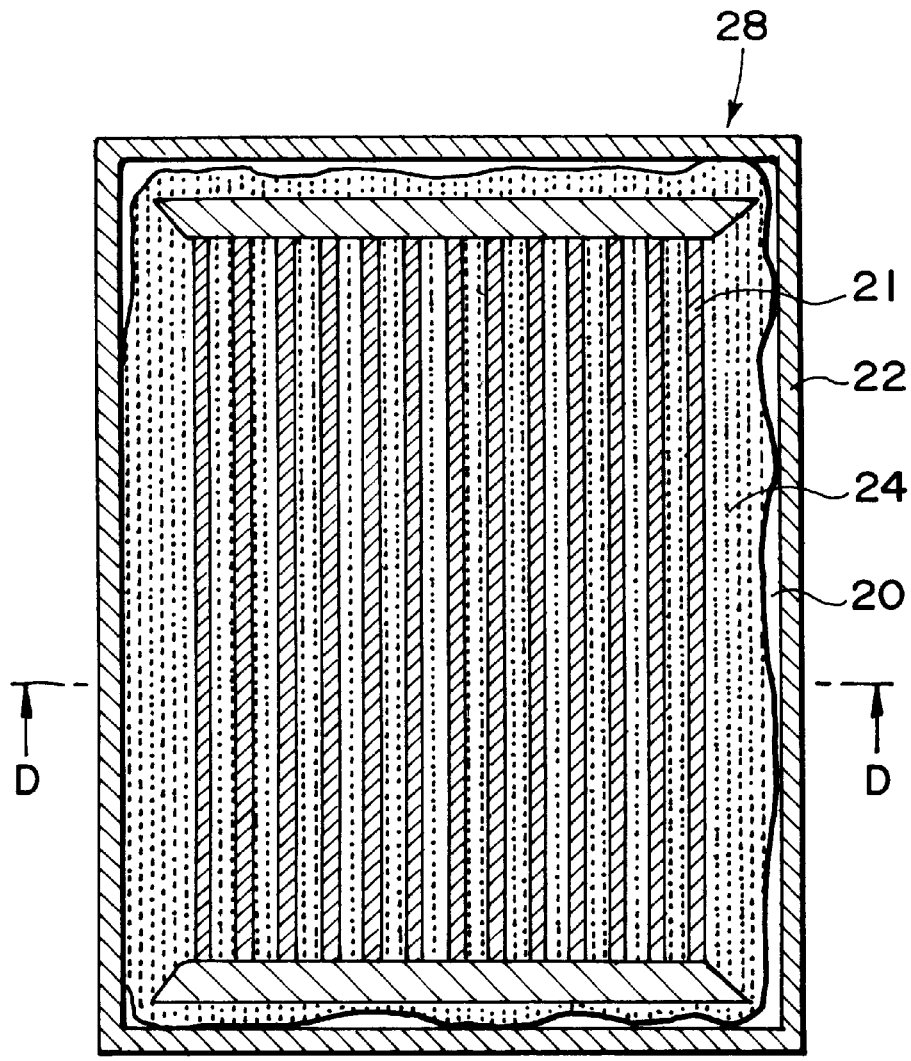
F I G. 15A
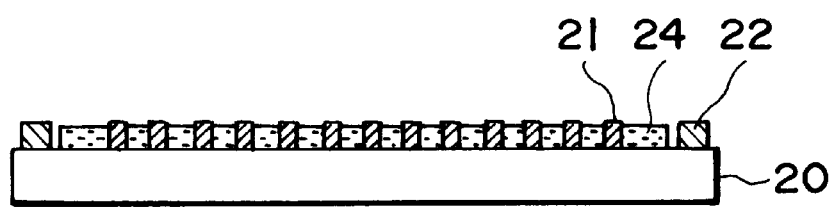
F I G. 15B

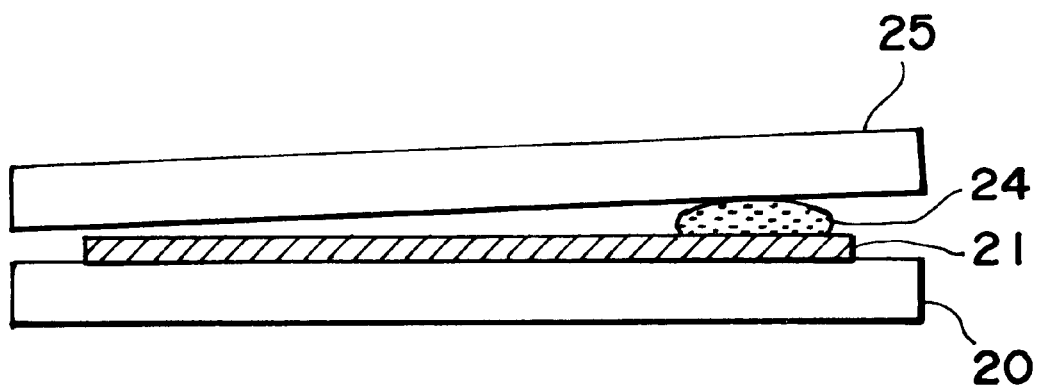
F I G. 18A
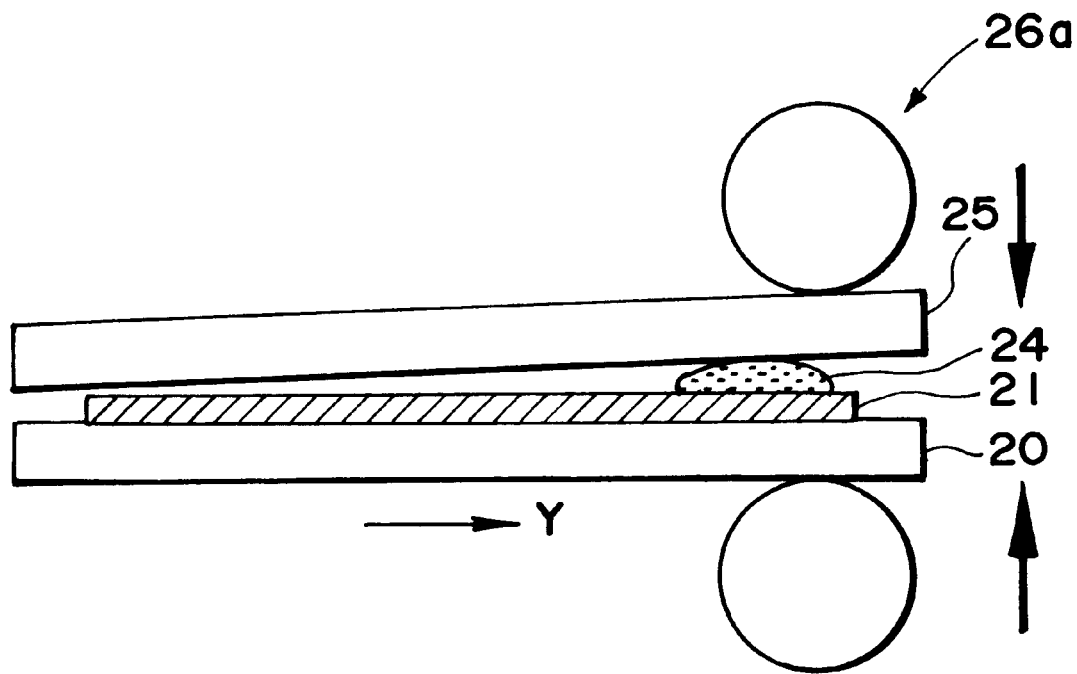
F I G. 18B

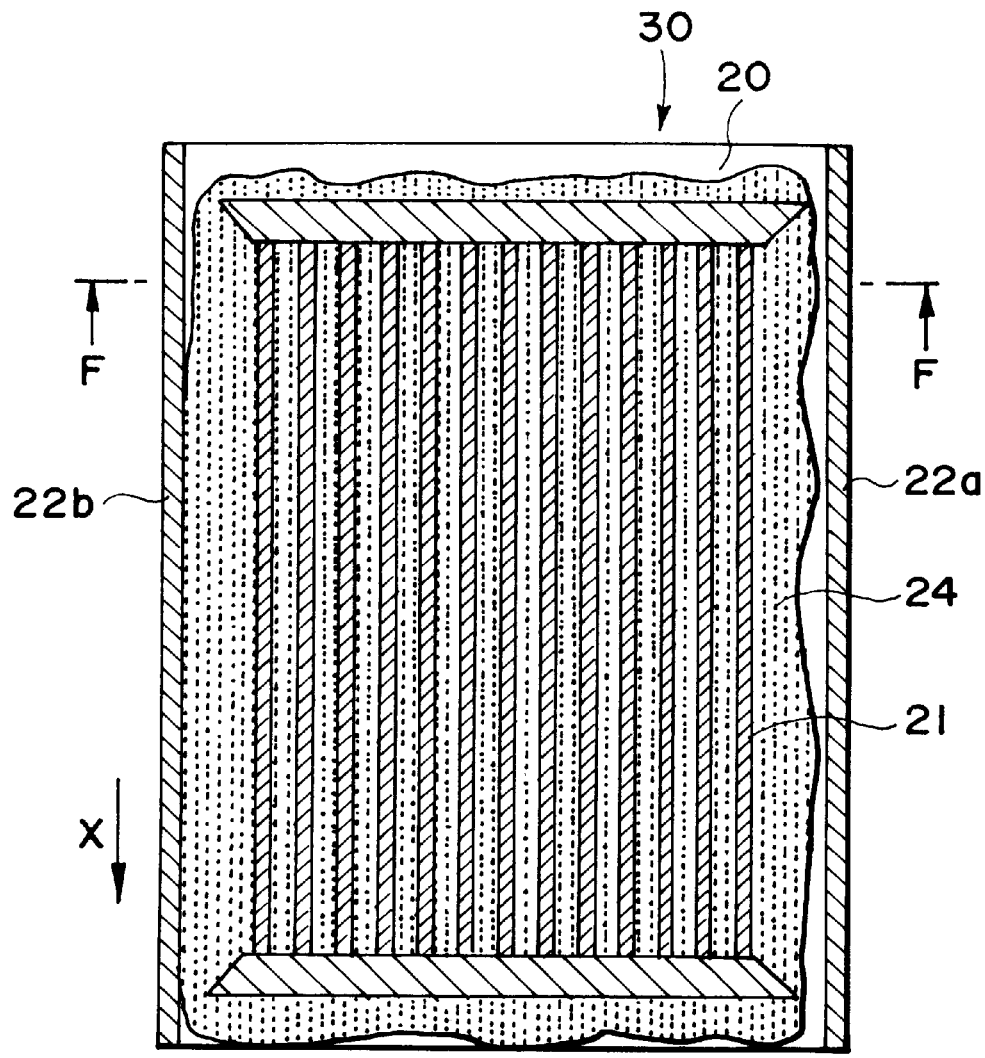
F I G. 19A
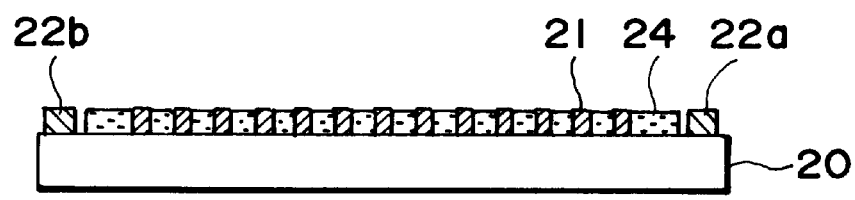
F I G. 19B

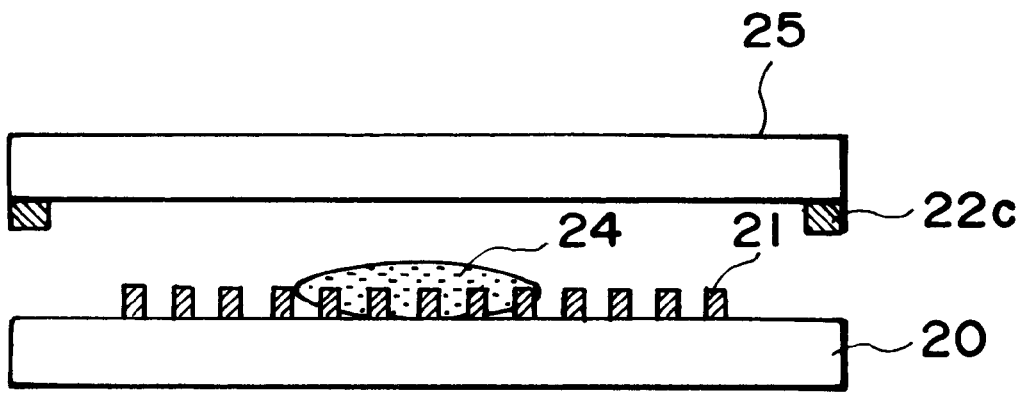
F I G. 20A
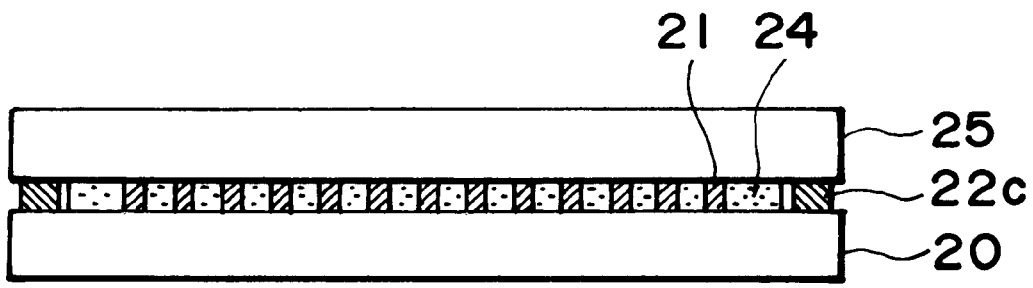
F I G. 20B

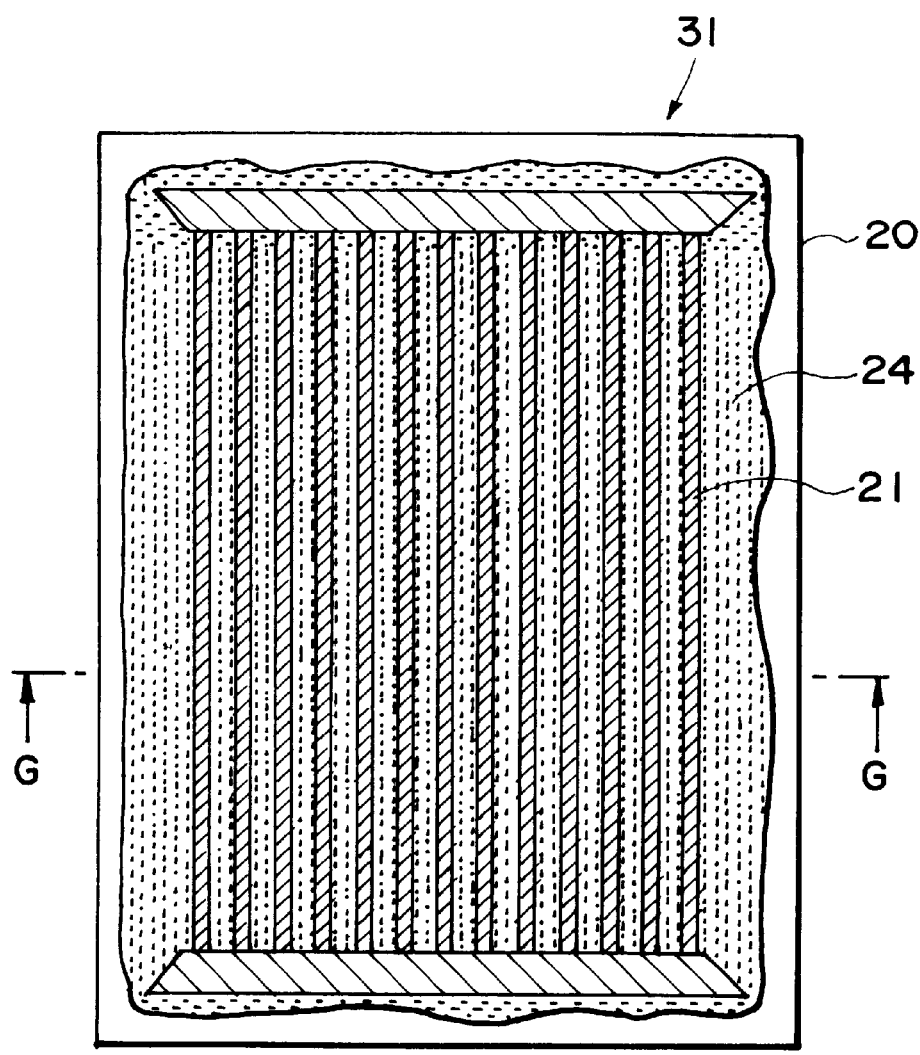
F I G. 21A
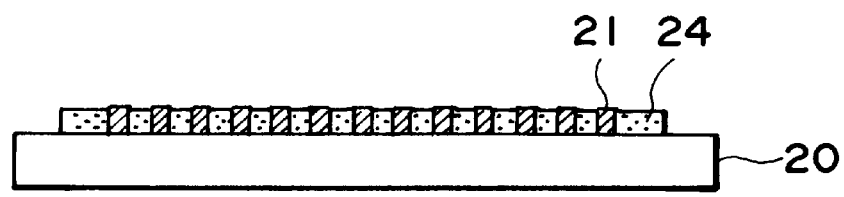
F I G. 21B

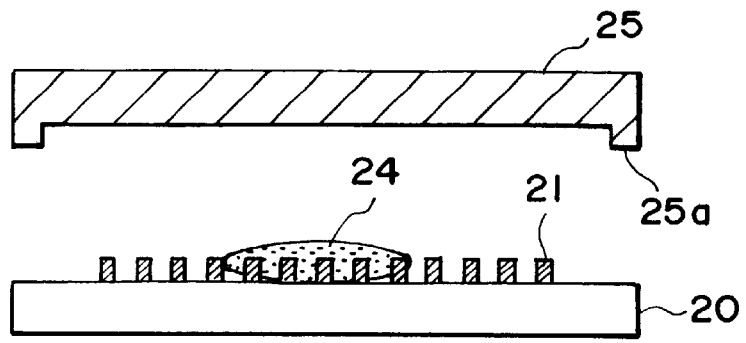
F I G. 22

ELECTRODE PLATE, PROCESS FOR PRODUCING THE PLATE, LIQUID CRYSTAL DEVICE INCLUDING SAME AND PROCESS FOR PRODUCING THE DEVICE

FIELD OF THE INVENTION AND RELATED ART

The present invention relates to an electrode plate including metal electrodes with gaps therebetween filled with a resin, a process for producing the electrode plate, a liquid crystal device including the electrode plate, and a process for producing the liquid crystal device.

Electrode plates conventionally used in liquid crystal devices of, e.g., a twisted nematic (TN)-type and a super twisted nematic (STN)-type generally comprise a glass substrate and transparent electrodes of ITO (indium-tin-oxide), etc., formed thereon. However, such transparent electrodes have a fairly high resistivity so that they have caused a problem of voltage waveform deformation due to electrical signal delay along with increases in size and resolution of the display area. This problem is particularly noticeable in the case of a liquid crystal device using a ferroelectric liquid crystal due to a smaller cell gap.

In order to solve the problem, it may be possible to increase the thickness of the transparent electrodes, but the formation of such thick transparent electrodes requires increased time and cost and results in a lower transparency of the electrodes.

In order to solve the above-mentioned problems, it has been practiced to form a metal electrode along a transparent electrode of a small thickness (as disclosed in Japanese Laid-Open Patent Application (JP-A) 2-63019). According to the practice, an electrode plate having metal electrodes thereon embedded with a transparent insulating material is provided, and transparent electrodes of ITO film, etc., are formed thereon so as to be electrically connected with the corresponding metal electrodes, respectively, via through-holes in the insulating material.

In producing an electrode plate having a structure as described above, it has been also proposed to use a transparent resin as the insulating material filling the gaps between the metal electrodes (e.g., JP-A 6-347810 and JP-A 8-304842) as illustrated in FIGS. 23 to 25.

According to the proposed process, as shown in FIG. 23A, on a smooth or smoothening mold substrate (hereinafter called "smooth plate") 100, a prescribed amount of a liquid resin of ultraviolet (UV)-curable resin 101 is placed dropwise by using a dispenser (not shown). Then, as shown in FIGS. 23B and 23C, a glass substrate 104 already provided with a pattern of ca. 1 μm-thick metal electrodes 103 is placed thereon so that the surface thereof provided with the metal electrodes 103 contacts the liquid resin 101.

Further, as shown in FIGS. 24A and 24B, the smooth plate 100 and the substrate 104 are pressed to each other to ensure an intimate contact over the entire area by pressing with a press 105. In this step, in order to ensure a good contact and electrical conductance between the metal electrodes 103 and corresponding transparent electrodes formed in a later step, the smooth plate 100 and the substrate 104 are caused to come in contact with each other strongly and uniformly over the entire area so as to remove the UV-curable resin 101 from the metal electrode surface completely or to the extent that a very small amount of the resin 101 remains on a part of the metal electrode surface.

Thereafter, the substrate 104 in contact with the smooth plate 100 is taken out from the press 105 and is irradiated with UV rays 106 from the substrate side by using a mask (not shown) disposed in a peripheral region of the substrate 104 to cure the UV-curable resin 101, as shown in FIG. 25A. Then, the smooth plate 100.is removed from the substrate 104 by using a peeling unit (not shown), followed by ultrasonic cleaning in, e.g., isopropyl alcohol (IPA) to remove the uncured resin, thus obtaining an electrode plate 107 having thereon a plurality of metal electrodes 103 and a UV-cured resin 101 filling the gaps between the metal electrodes 103, as shown in FIGS. 25B and 25C.

In the above-described production process of the electrode plate, however, as shown in FIG. 24B, a part 101a of the UV-curable resin 101 flows out or is squeezed out from the side (edge) portions between the smooth plate 100 and the glass substrate 104 under pressure in the pressing (or resin-filling) step. In such a state, even when the smooth plate 100 and the glass substrate 104 are further pressed against each other by further increasing an applied pressure by means of the press 105, the UV-curable resin 101 disposed therebetween is not extended or expanded any longer. As a result, a part of the gaps between the metal electrodes 103 is not filled or is partially filled with the UV-curable resin 101 to result in an uneven surface portion, thus being liable to cause adhesion (or contact) failure between the metal electrodes and associated transparent electrodes, respectively, in a later step.

Further, the flowing-out part 101a of the UV-curable resin 101 as described above is attached to and contaminates the press 105, thus leading to dirt when such a press 105 is repetitively used. Consequently, a production yield of the electrode plate is liable to be lowered.

SUMMARY OF THE INVENTION

In view of the above-mentioned problems, a principal object of the present invention is to provide an electrode plate improved in uniformity and flatness (or planarity) of a resin filling gaps between metal electrodes formed on a substrate and capable of preventing contamination due to flowing-out of the resin, thus enhancing a product yield, and a liquid crystal device including such an electrode plate.

Another object of the present invention is to provide processes for producing an electrode plate and a liquid crystal device as described above.

According to the present invention, there is provided an electrode plate, comprising: a substrate, a plurality of metal electrodes formed with gaps therebetween in a prescribed pattern on the substrate, and a resin filling the gaps; wherein the substrate is provided with an elongated projection disposed in a peripheral region thereof.

According to another aspect of the present invention, there is provided a process for producing an electrode plate comprising the steps of:

forming on a substrate a plurality of metal electrodes with gaps therebetween in a prescribed pattern, forming an elongated projection in a peripheral region of the substrate, placing a resin between the substrate and a mold substrate, and filling the gaps with the resin by pressing within a region inside said elongated projection.

According to another aspect of the present invention, there is also provided a process for producing an electrode plate comprising the steps of:

forming on a substrate a plurality of metal electrodes with gaps therebetween in a prescribed pattern, forming an elongated projection in a peripheral region of a mold substrate, placing a resin between the substrate and the mold substrate, and filling the gaps with the resin by pressing within a region inside said elongated projection.

According to a further aspect of the present invention, there is provided a liquid crystal device, comprising: a pair of oppositely disposed plates, and a liquid crystal disposed between the plates; at least one of the plates having an electrode plates comprising:

a substrate, a plurality of metal electrodes formed with gaps therebetween in a prescribed pattern on the substrate,: and a resin filling the gaps, and a plurality of transparent electrodes each electrically connected with an associated metal electrode; wherein the substrate is provided with an elongated projection disposed in a peripheral region thereof.

According to a still further aspect of the present invention, there is provided a process for producing a liquid crystal device in which a liquid crystal is disposed between a pair of oppositely disposed plates including at least one electrode plate comprising: a substrate, a plurality of metal electrodes formed with gaps therebetween on the substrate, a resin filling the gaps, and a plurality of transparent electrodes each electrically connected with an associated metal electrode; the process comprising the steps of:

forming on a substrate a plurality of metal electrodes with gaps therebetween in a prescribed pattern, forming an elongated projection in a peripheral region of the substrate, and filling the gaps with the resin within a region inside said elongated projection.

According to a still further aspect of the present invention, there is also provided a process for producing a liquid crystal device in which a liquid crystal is disposed between a pair of oppositely disposed plates including at least one electrode plate comprising: a substrate, a plurality of metal electrodes formed with gaps therebetween on the substrate, a resin filling the gaps, and a plurality of transparent electrodes each electrically connected with an associated metal electrode; the process comprising the steps of:

forming on a substrate a plurality of metal electrodes with gaps therebetween in a prescribed pattern, forming an elongated projection in a peripheral region a mold substrate, placing a resin between the substrate and the mold substrate, and filling the gaps with the resin by pressing within a region inside said elongated projection.

When a resin filling gaps between metal electrodes formed on a substrate is flattened or smoothed by pressing, it is very difficult to accurately control an appropriate amount of the resin supplied for forming a smooth and even surface, so that a part of the resin pressed between the substrate and a mold (smooth) plate is liable to be squeezed out from the sides of the substrate to cause an irregularly filled portion (unfilled or partially filled portion) of the resin as described above.

We have found that the gaps between metal electrodes are effectively filled with the resin with a good uniformity and planarity in a pressing step by providing an elongated projection in a peripheral region of a substrate or a mold plate.

These and other objects, features and advantages of the present invention will become more apparent upon a consideration of the following description of the preferred embodiments of the present invention taken in conjunction with the accompanying drawings, wherein identical parts or members are denoted by identical reference numerals, unless otherwise noted expressly.

BRIEF DESCRIPTION OF THE DRAWINGS

FIG. 1 is a schematic sectional view showing an example of a liquid crystal device including an electrode plate according to the present invention.

FIGS. 6–9 are schematic views for illustrating an embodiment of a process for producing an electrode plate of the present invention; wherein FIG. 7 shows a state of pressing the substrate and the mold plate to each other by a press, FIG. 8 shows a state of irradiating the UV-curable resin with UV-rays.

FIGS. 11–15 are schematic views for illustrating a process for producing an electrode plate of the present invention adopted in Example 1 appearing hereinafter; wherein FIG. 11 shows a state of a substrate provided with metal electrodes and an elongated projection before supplying a UV-curable resin, FIG. 12A shows a state of placing the UV-curable resin between metal electrodes, FIG. 12B shows a state before pressing the UV-curable resin between the substrate and a mold plate, FIG. 12C shows an intimate contact state between the substrate and the mold plate, FIG. 13 shows a state of pressing the substrate and the mold plate to each other with a press, FIG. 14 shows a state of irradiating the UV-curable resin with UV rays, FIG. 15A is a plan view of a resultant electrode plate, and FIG. 15B is a sectional view of the electrode plate taken along a D—D line in FIG. 15A.

FIGS. 17–19 are schematic views for illustrating a process for producing an electrode plate of the present invention adopted in Example 2; wherein FIG. 18A shows a state before pressing the UV-curable resin between the substrate and a mold plate FIG. 18B shows a state of pressing the substrate and the mold plate to each other with a roller press, FIG. 19A is a plan view of a resultant electrode plate, and FIG. 19B is a sectional view of the electrode plate taken along an F—F line in FIG. 19A.

FIGS. 20–21 are schematic views for illustrating a process for producing an electrode plate of the present invention adopted in Example 4; wherein FIG. 20A shows a state of placing a UV-curable resin on a substrate disposed opposite to a mold plate provided with an elongated projection, FIG. 20B shows a state after pressing the substrate and the mold plate to each other, FIG. 21A is a plan view of a resultant electrode plate, and FIG. 21B is a sectional view of the electrode plate taken along a G—G line in FIG. 21A.

FIG. 22 is a schematic sectional view of a mold plate provided with an elongated projection employed in Example 5 and a substrate provided with metal electrodes between which a UV-curable resin is placed.

FIGS. 23–25 are schematic views for illustrating an embodiment of a conventional process for producing an electrode plate, wherein

DESCRIPTION OF THE PREFERRED EMBODIMENTS

Figure 2A:
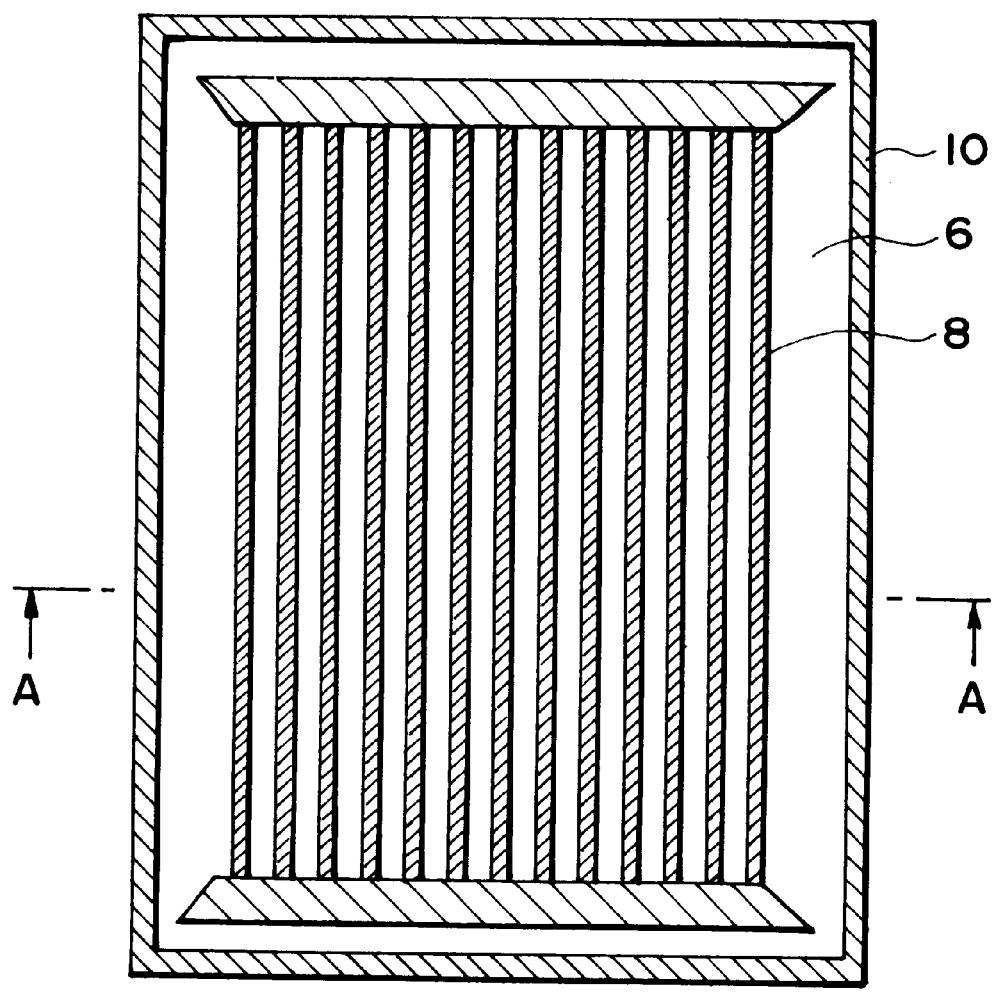
FIG. 2A is a schematic plan view of an example of an electrode plate of the present invention showing a state before filling a UV-curable resin in gaps between metal electrodes.

Hereinbelow, preferred embodiments of the present invention will be described specifically with reference to the drawings.

FIG. 1 is a schematic sectional view of an example of a liquid crystal device including an electrode plate according to the present invention.

Referring to FIG. 1, a liquid crystal device 1 includes a pair of oppositely disposed electrode plates 3a and 3b sandwiched between a pair of polarizers 2a and 2b, and a liquid crystal 4, such as a ferroelectric liquid crystal, disposed between the electrode plates 3a and 3b together with a spherical spacer (spacer beads) 5 for retaining a prescribed cell gap (or a thickness of the liquid crystal layer 4).

Each electrode plate 3a (3b) includes a glass substrate 6a (6b), a plurality of metal electrodes 8a (8b) with gaps therebetween and formed on the glass substrate 6a (6b), an insulating layer (film) 7a (7b) filling the gaps between the metal electrodes 8a (8b) to form a surface in combination with the metal electrodes 8a (8b), and a plurality of transparent electrodes 9a (9b) formed on the surface and each electrically connected with an associated metal electrode 8a (8b).

Each transparent electrodes 9a (9b) are formed in a stripe shape and intersect with each other at right angles to form an electrode matrix in combination. On each transparent electrodes 9a (9b), an alignment layer 11a (11b) is formed.

The metal electrodes 8a (8b) may generally comprise a metallic material selected from the group consisting of Cr, Cu, Ag and Al. The insulating layer 7a (7b) may generally comprise a UV-cured resin formed by curing a UV-curable resin through irradiation with UV rays.

Figure 2B:
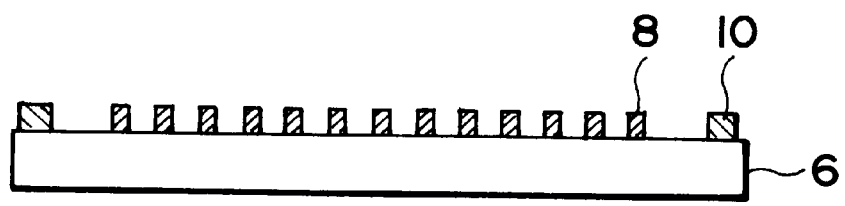
FIG. 2B is a schematic sectional view showing an A—A section thereof.

FIG. 2A is a schematic plan view showing a state before the filling of a UV-curable resin with respect to at least one of the electrode plates 3a and 3b, and FIG. 2B shows an A—A section of FIG. 2A.

Referring to FIGS. 2A and 2B, metal electrodes 8 are formed in a stripe pattern on the glass substrate 6. In an entire peripheral region (proximate to the entire periphery or four side portions) of the glass substrate 6, an elongated projection 10 is formed in a thickness (height) substantially identical to that of the metal electrodes 8 so as to surround the metal electrodes 8. In this embodiment; the elongated projection 10 is cut off in a cutting step of a process for producing the liquid crystal device 1 as shown in FIG. 1, so that the elongated projection 10 does not remain in the resultant liquid crystal device 1.

The elongated projection 10 and the metal electrodes 8 may preferably be formed of identical metal species in a common step. In the present invention, however, the elongated projection 10 may also be formed of a different material other than metal, such as a photoresist, by a separate step from the production of the metal electrodes 8. The thickness of the elongated projection 10 may preferably be substantially equal to that of the metal electrodes 8, as described above, but may be different from that of the metal electrodes 8 within an extent of not causing a strain of the glass substrate 6. The elongated projection 10 may preferably have a width of 1–20 mm, more preferably 3–15 mm, particularly 5–10 mm. The width of the elongated projection 10 may be above 20 mm but in such a case, the resultant elongated projection 10 occupies a larger region on the glass substrate 6. On the other hand, if the elongated projection 10 has a width of below 1 mm, a possibility that a UV-curable resin (not shown) flows over the elongated projection 10 and flows out from the peripheral region of the glass substrate 6 is liable to be increased. The elongated projection 10 used in the present invention may be provide with at least one spacing or cut for air escape (or air vent). Such a spacing may preferably be formed at a side perpendicular to the longitudinal direction of the metal electrodes 8.

Figure 3A:
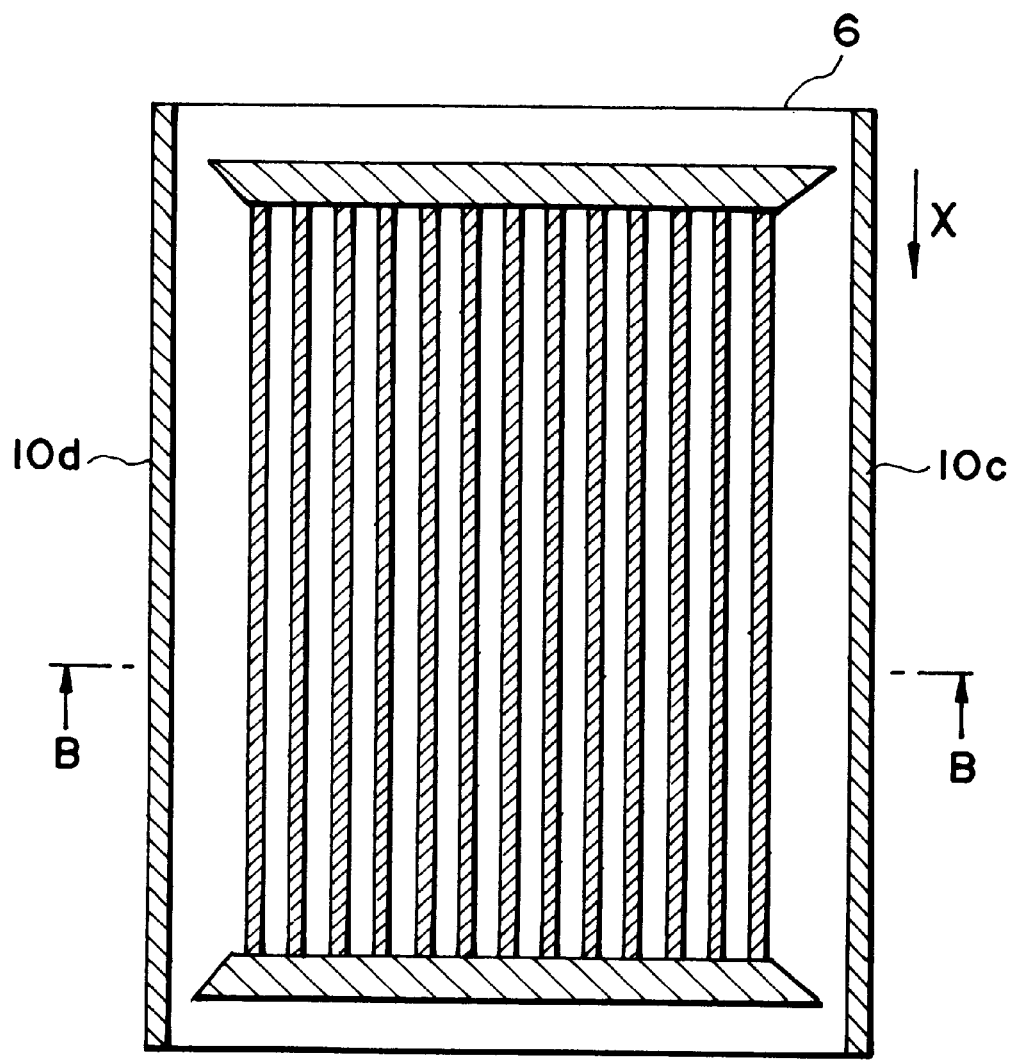
FIG. 3A is a schematic plan view of another example of an electrode plate of the present invention showing a state before filling a UV-curable resin in gaps between metal electrodes.
Figure 3B:
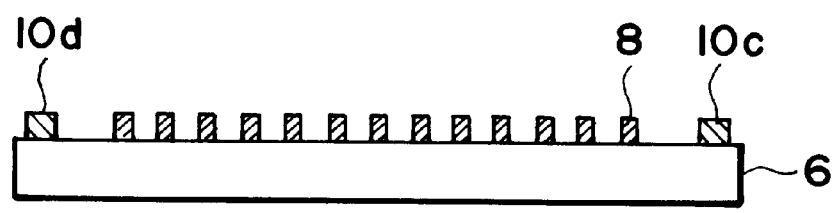
FIG. 3B is a schematic sectional view showing a B—B section thereof.

In the case where pressing of the UV-curable resin placed between the glass substrate 6 and a mold plate (not shown) is performed successively in a certain direction by using a roller press including two opposite rollers so that the UV-curable resin is caused to be uniaxially or unidirectionally extended. In this case, the flowing-out of the resin is liable to be caused in the direction along which the pressure is successively applied to the resin (e.g., a direction X shown in FIG. 3A) parallel to a longitudinal direction of the metal electrodes 8. Accordingly, in such a case, it is preferred that the elongated projection includes two elongated portions 10c and 10d formed in a peripheral region located at opposite sides (parallel to a longitudinal direction of the metal electrodes) of the glass substrate 6 as shown in FIGS. 3A and 3B.

Figure 4A:
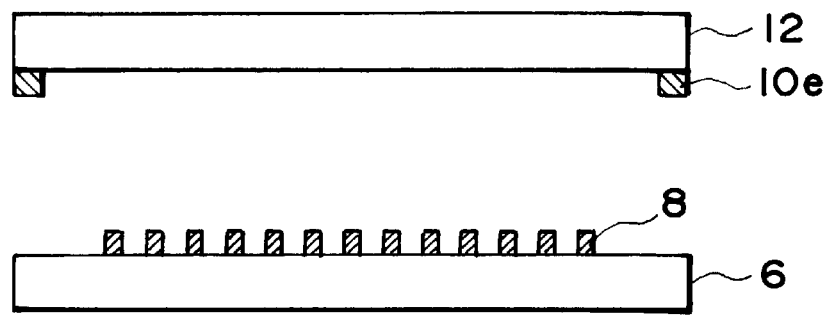
FIG. 4A is a schematic sectional view of an example of a mold plate provided with an elongated projection and an associated electrode plate before filling a UV-curable resin adopted in a process for producing an electrode plate of the present invention.
Figure 4B:
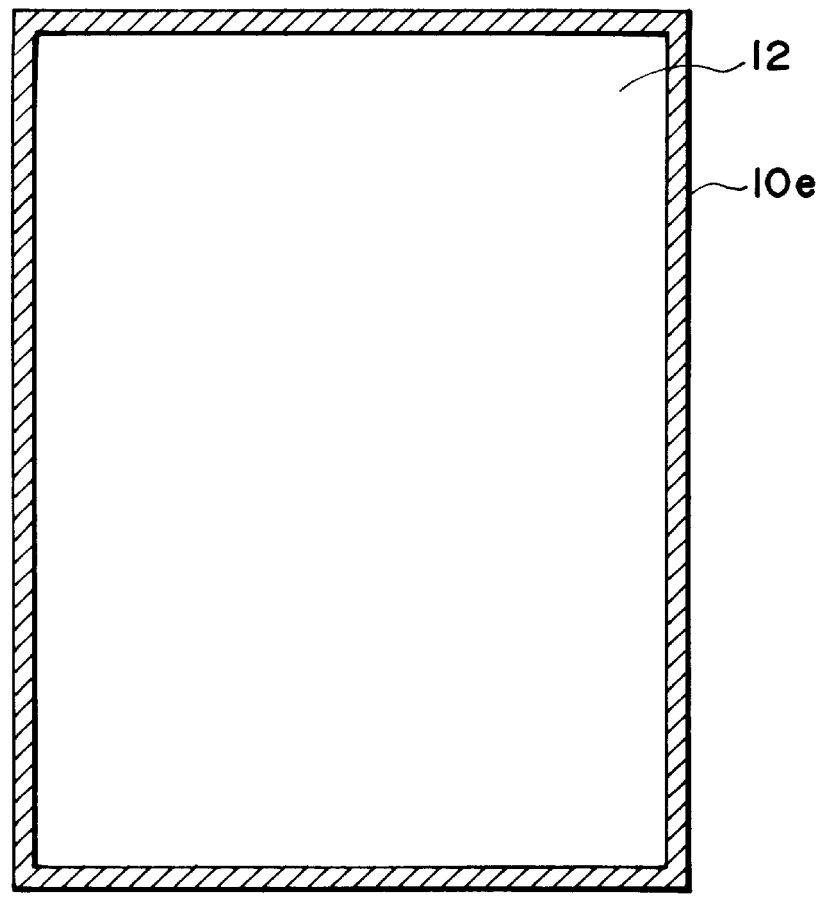
FIG. 4B is a schematic plan view of the mold plate shown in FIG. 4A.
Figure 5:
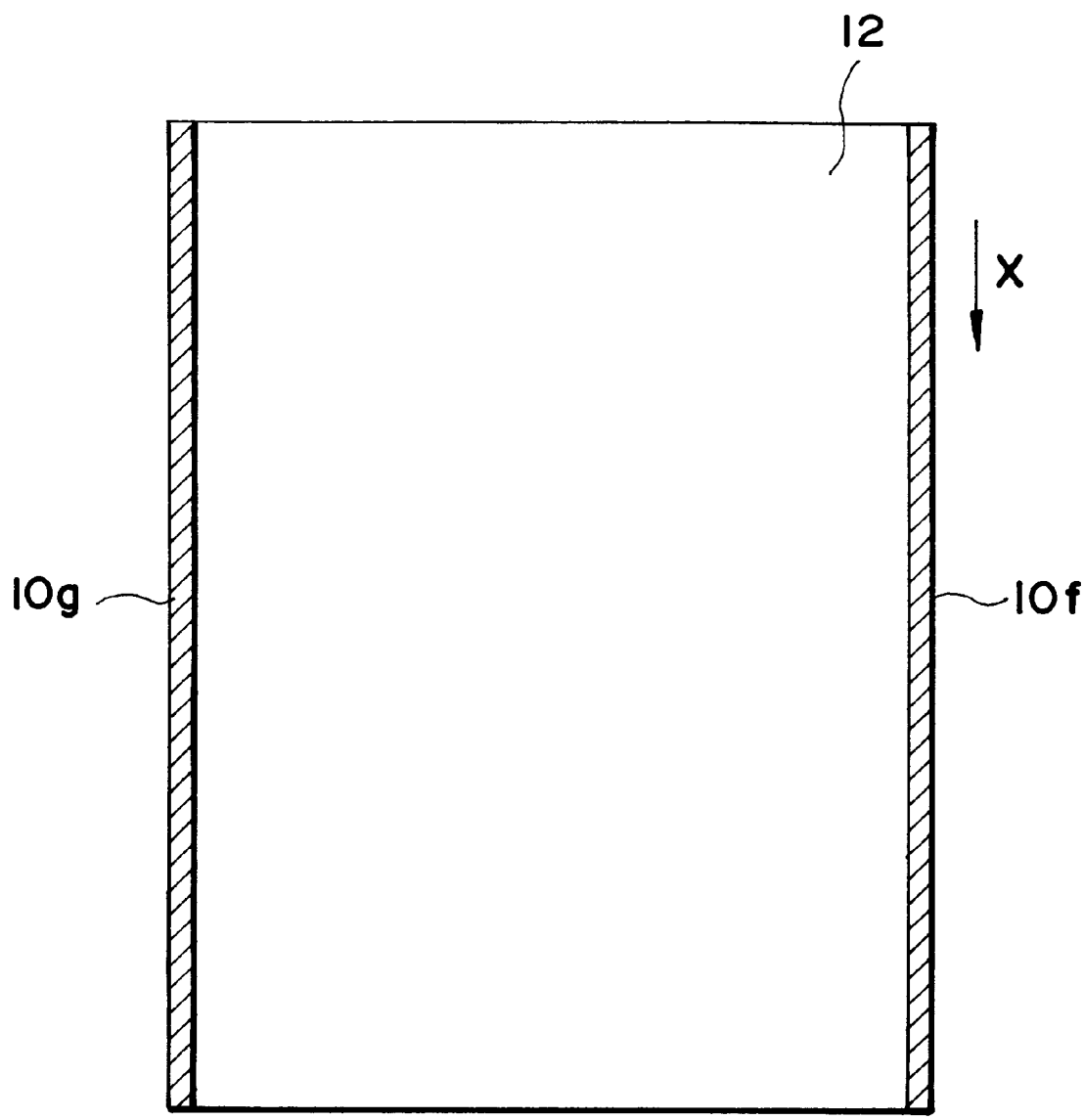
FIG. 5 is a schematic plan view of another example of a mold plate used in the present invention.

Further, instead of the elongated projection 10 formed on the glass substrate 6 as shown in FIGS. 2A and 2B, it is possible to form an elongated projection 10e in a peripheral region of a mold plate 12 as shown in FIGS. 4A and 4B. As shown in FIG. 5, it is also possible to form an elongated projection including two elongated projections 10f and 10g located at opposite sides of a peripheral region of a mold plate 12 and each in parallel with a uniaxial direction X along which a UV-curable resin (not shown) is successively extended by pressing.

In the present invention, the elongated projection (10, 10c, 10d, 10e, 10f and 10g in FIGS. 2A, 2B, 3A, 3B, 4A, 4B and 5) is required to provide a certain spacing between the projection and an adjacent (outer) metal electrode 8 so as to store a part of the UV-curable resin flowed over gaps between the metal electrodes 8 without causing flow-out of the UV-curable resin from the glass substrate (or mold plate) side. The spacing may generally be set to at least 5 mm, preferably at least 8 mm, more preferably at least 10 mm, in width at the time of designing the pattern of the elongated projection as shown in FIGS. 2–5 described above. By designing the elongated projection 10 (10c–10f) so as to have the appropriate spacing with an adjacent metal electrode as described above in a contact state between the glass substrate 6 and the mold plate 12, it is possible to prevent the UV-curable resin from flowing out from the sides:of the glass substrate 6 (or the mold substrate 12), thus effectively suppressing an occurrence of an insufficient filling portion of the UV-curable resin. As a result, the metal electrodes 8 can be embedded with the UV-curable resin with good uniformity and flatness (or planarity).

An embodiment of a process for producing an electrode plate (e.g., the electrode plate 3a (3b) for constituting the liquid crystal device 1 shown in FIG. 1) according to the present invention will be described with reference to FIGS. 6–9.

Figure 6A:
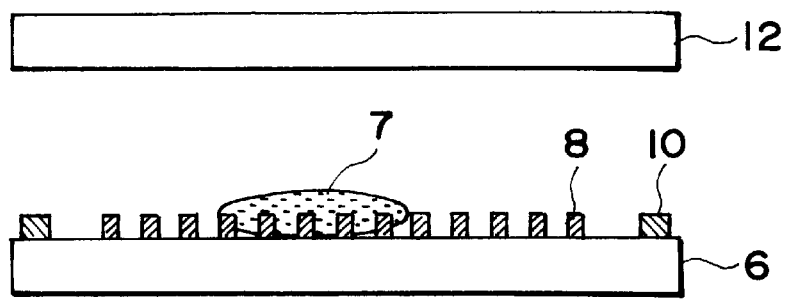
FIG. 6A shows a state of placing dropwise a UV-curable resin on a substrate disposed opposite to a mold plate.
Figure 6B:
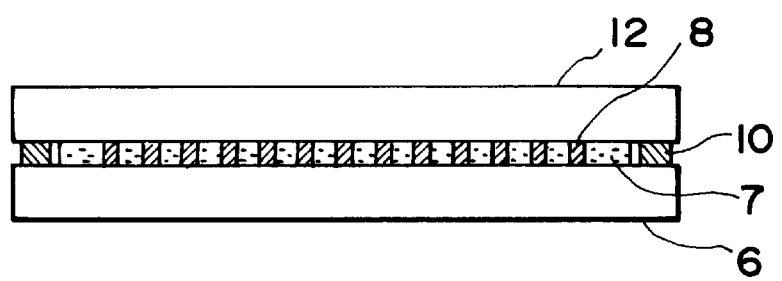
FIG. 6B shows a state of a intimate contact between the substrate and the mold plate.

First, on a glass substrate 6, a plurality of metal electrodes 8 and an elongated projection 10 are formed in a common step so that the metal electrodes 8 are surrounded by the elongated projection 10 in a peripheral region of the glass substrate 6 including all the (four) side portions. Thereafter, an appropriate amount of a UV-curable resin 7 is placed dropwise on a part of gaps between the metal electrodes 8 formed on the glass substrate 6, and a mold plate 12 is caused to make contact with the glass substrate 6 via the UV-curable resin 7 (FIGS. 6A and 6B).

The metal electrodes 8 and the elongated projection 10 may be formed at the same time in a common step such that a metal film layer is formed on the glass substrate 6 by sputtering and then is subjected to patterning through a photolithographic process. The mold plate 12 may be formed of, e.g., metal, glass, ceramic or synthetic resin and the UV-curable resin 7 may be comprises those of epoxy-type or acrylate-type. The UV-curable resin 7 may be placed dropwise on the mold plate 12.

Figure 7:
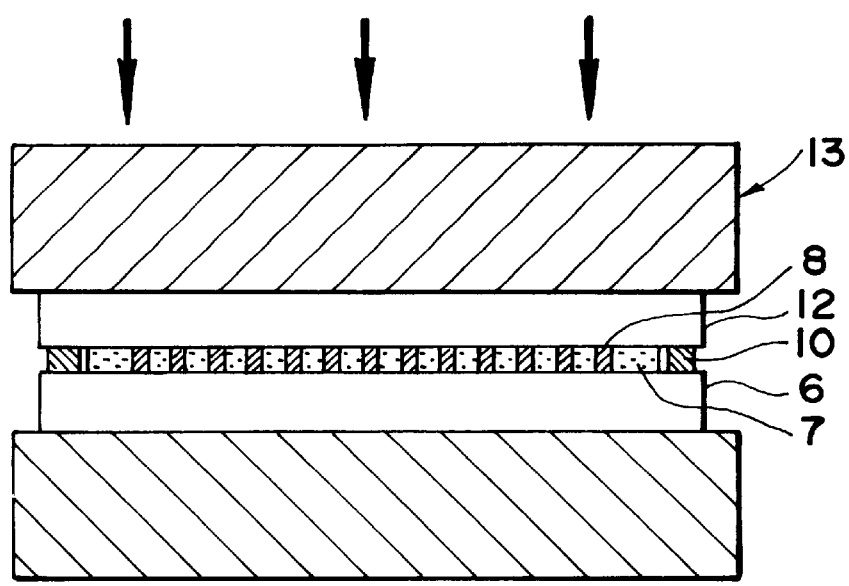
Figure 8:
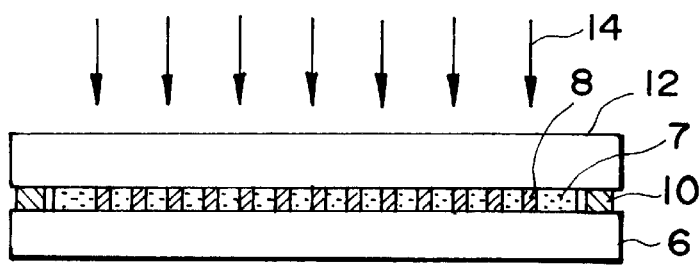
Figure 9A:
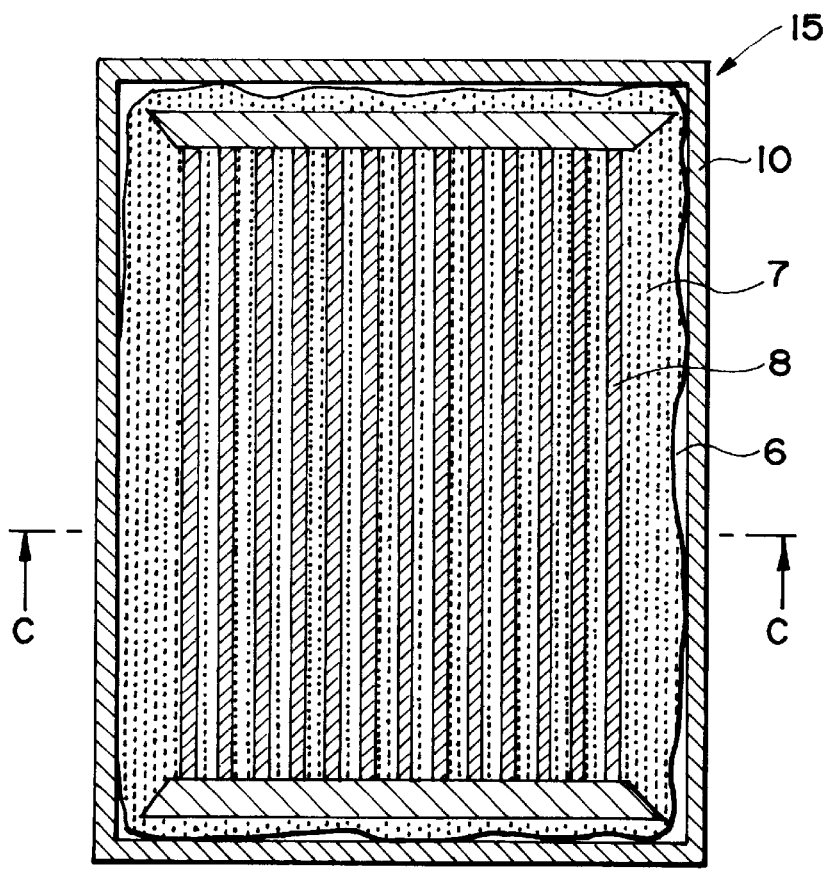
FIG. 9A is a plan view of a resultant electrode plate.

Then, the glass substrate 6 in contact with the mold plate 12 is placed in a press 13 and pressed by the press from the outside of the mold plate 12, thus causing an intimate contact of the glass substrate 6 with the mold plate 12 (FIG. 7). In such a pressing state, the flattened UV-curable resin 7 is completely removed from the entire surface of the metal electrodes 8 contacting the mold plate 12 or is substantially removed from the metal electrode surface to the extent that a very small amount of the UV-curable resin 7 remains thereon. Thereafter, the glass substrate 6 pressed together with the mold plate 12 is taken out from the press 13 and is irradiated with UV rays 14 from the mold plate side to cure the UV-curable resin 7, followed by removal (peeling) of the mold plate 12 from the glass substrate 6 to provide an electrode plate 15 (FIGS. 8, 9A and 9B).

The irradiation of UV rays 14 may be performed from the glass substrate side or from both sides of the mold plate 12 and the glass substrate 6 at the same time.

Figure 9B:
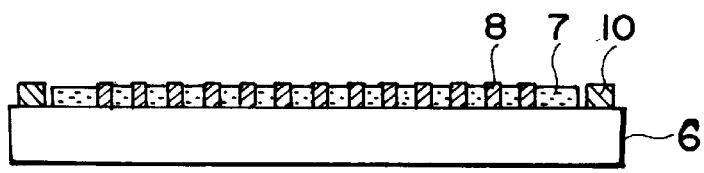
FIG. 9B is a sectional view of the electrode plate taken along a C—C line in FIG. 9A.
Figure 10:
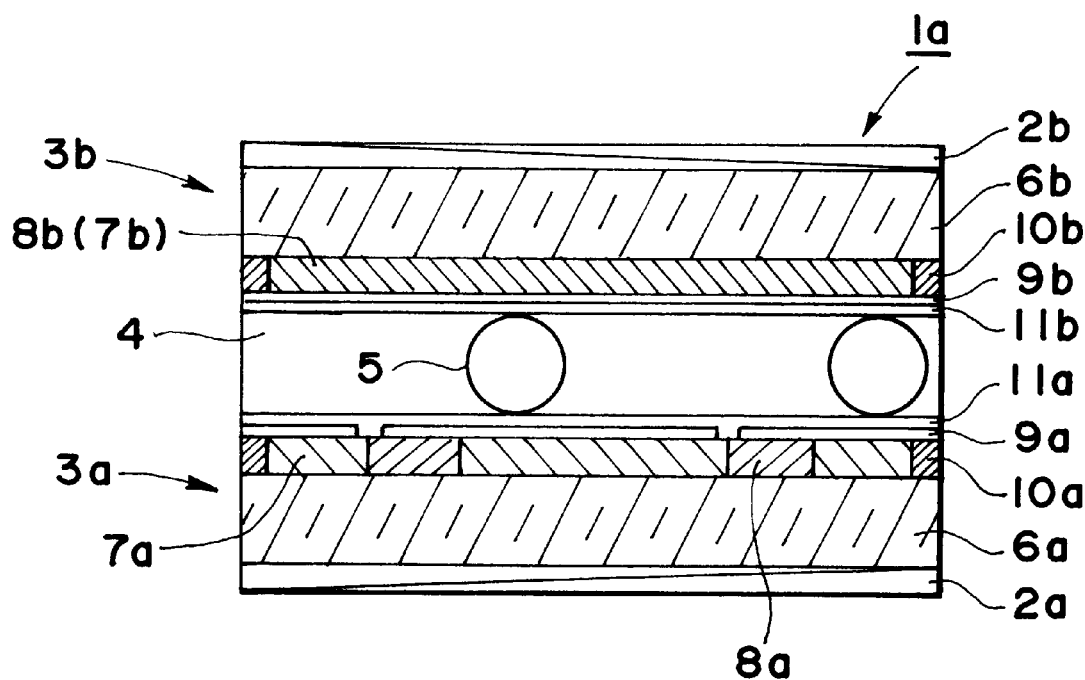
FIG. 10 is a schematic sectional view showing another example of a liquid crystal device including an electrode plate of the present invention.

Thereafter, on a surface formed by the UV-cured resin 7 and the metal electrode 8 (as shown in FIG. 9B), a plurality of transparent electrodes (not shown) are formed by sputtering and patterning to prepare an electrode plate 3a (3b) shown in FIG. 1.

As described above, when the UV-curable resin 7 is pressed between the glass substrate 6 and the mold plate 12 by the press 13 as shown in FIG. 7, a forward end of the UV-curable resin after filling the gaps between the metal electrodes 8 remains or stays at the spacings between the elongated projection 10 and an adjacent metal electrode 8, thus not escaping from the side of the glass substrate 6 (or the mold plate 12). As a result, the gaps between the metal electrodes 8 are uniformly filled with the UV-curable resin 7 to provide a flat or smooth surface of the metal electrodes 8 and the UV-curable resin 7 in combination.

Further, the prevention of the escape (flowing-out) of the UV-curable resin 7 from the glass substrate 6 is also effective in suppressing contamination of a tool, such as the press 13, so that it becomes possible to prevent a lowering in product yield due to the attachment of the UV-curable resin to the press 13 even if the press 13 is used again as it is.

In the above-described embodiment, the elongated projection 10 is cut out in a cutting step in production of the liquid crystal device 1 shown in FIG. 1. In the present invention, however, it is possible to produce a liquid crystal device la including a pair of electrode plates 3a and 3b each provided with an elongated projection 10 (10b) to a glass substrate 6a (6b) in its peripheral region including all the (four) side portions or opposite two side portions.

The liquid crystal device according to the present invention may be prepared by filling a liquid crystal material, preferably be a ferroelectric liquid crystal, in a gap between the above-prepared pair of electrodes plates 3a and 3b held by spacer beads 5.

Hereinbelow, the present invention will be described more specifically with reference to Examples.

EXAMPLE 1

An electrode plate was prepared through a process as illustrated by FIGS. 11–15.

On a 100 mm-square (100 mm×100 mm) glass substrate 20 of 1 mm in thickness, stripe metal electrodes 21 of Cr were formed each in a width of 10 $\mu$m and a thickness of 2 $\mu$m and at a pitch of 100 $\mu$m and, simultaneously in an entire peripheral region of the glass substrate 20, a 2 $\mu$m-thick elongated projection 22 (of Cr) was formed in a width of 5 mm and with a spacing of 10 mm from the closest metal electrode (FIG. 11). The metal electrodes 21 and the elongated projection 22 were formed through a common process wherein a Cr layer was formed on the glass substrate 20 by sputtering and then was subjected to patterning through a photolithographic process.

The resultant glass substrate 20 was subjected to an ozone treatment under UV irradiation for 5 min. and then to spin coating with a silane coupling agent ("A-174", mfd. by Nippon Unicar K.K.) diluted with four times of ethyl alcohol, followed by heat-treatment at 100° C. for 20 min. so as to improve the adhesion with resin.

On metal electrodes 21 formed on the glass substrate 20, 40 mg of an acrylic UV-curable resin 24 (in the form of a monomer solution comprising a mixture of pentaerythritol triacrylate/neopentyl glycol diacrylate/1-hydroxycyclohexyl phenyl ketone (=50/50/2)) was placed dropwise by using a dispenser 23 (FIG. 12A).

A glass-made mold plate 25 was applied to contact the glass substrate 20 with the UV-curable resin 24 therebetween (FIGS. 12B and 12C), and the glass substrate 20 and the mold plate 25 were supplied with a pressure of 20 kg/cm² for 3 min. by a press 26 (FIG. 13). At this time, the forward end of the UV-curable resin 24 was blocked with the elongated projection 22.

The laminate of the glass substrate 20 and the mold plate 25, after taking out from the press 26, was irradiated with UV rays 27 having a central wavelength of 365 nm at an intensity of 200 mJ/cm² from the mold plate side, thus curing the UV-curable resin 24 (FIG. 14).

Then, the mold plate 25 was removed from the glass substrate 20 by using a releasing tool (not shown), and the resultant glass substrate 20 was subjected to ultrasonic washing within isopropanol to remove the uncured UV-curable resin to obtain an electrode plate 28 (FIGS. 15A and 15B).

According to the electrode plate 28 prepared in this example, the UV-curable resin 24 was effectively prevented from flowing out from the sides of the glass substrate 20 by providing the elongated projection 22, thus uniformly filling the gaps between the metal electrodes 21 with the UV-cured resin 24 with a good planarity (or flatness).

Comparative Example

Figure 16A:
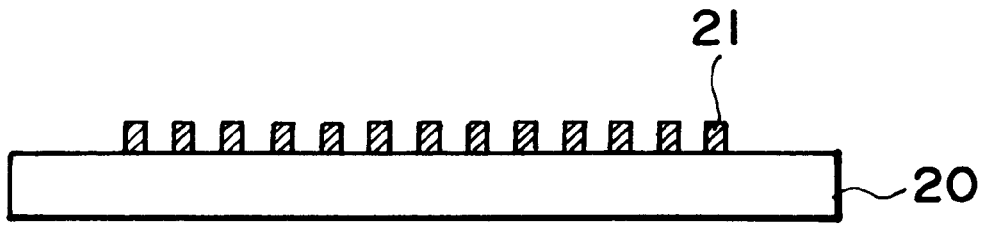
FIG. 16A is a schematic sectional view of a substrate provided with metal electrodes for preparing an electrode plate used in Comparative Example.
Figure 16B:
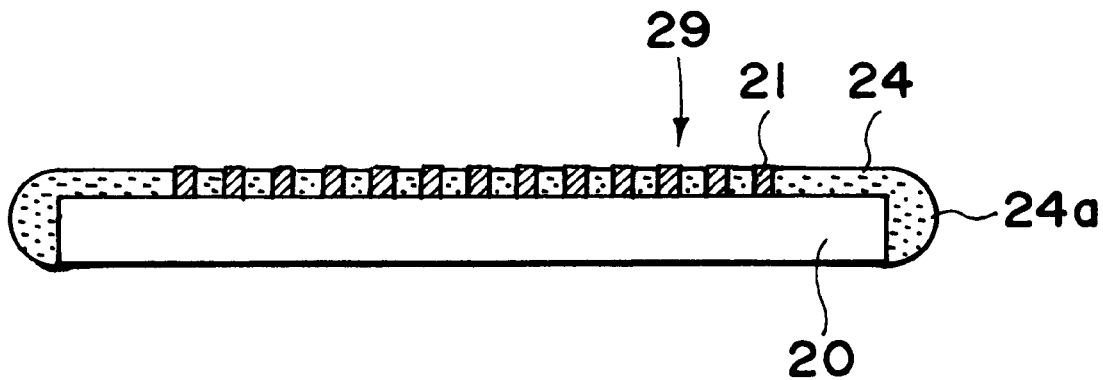
FIG. 16B is a schematic sectional view of a resultant electrode plate used in Comparative Example.

A comparative electrode plate 29 was prepared through a process as illustrated by FIGS. 16A and 16B.

The comparative electrode plate 29 was prepared in the same manner as in Example 1 except that the elongated projection 22 was not formed.

In the pressing step for production of the comparative electrode plate 29, a part 24a of the UV-curable resin 24 flowed out from the sides of the glass substrate 20 as shown in FIG. 16B. As a result, a portion of the gaps between the metal electrodes 21 closer to the flowing-out part 24a caused a shortage of the UV-curable resin 24, thus resulting in an uneven surface portion with a poor planarity.

Further, also in the pressing step, the flowing-out part 24a of the UV-curable resin 24 contaminated the pressing surface of the press 26, thus requiring an additional washing (cleaning) step for the press 26.

EXAMPLE 2

An electrode plate was prepared through a process as illustrated by FIGS. 17–19.

Figure 17A:
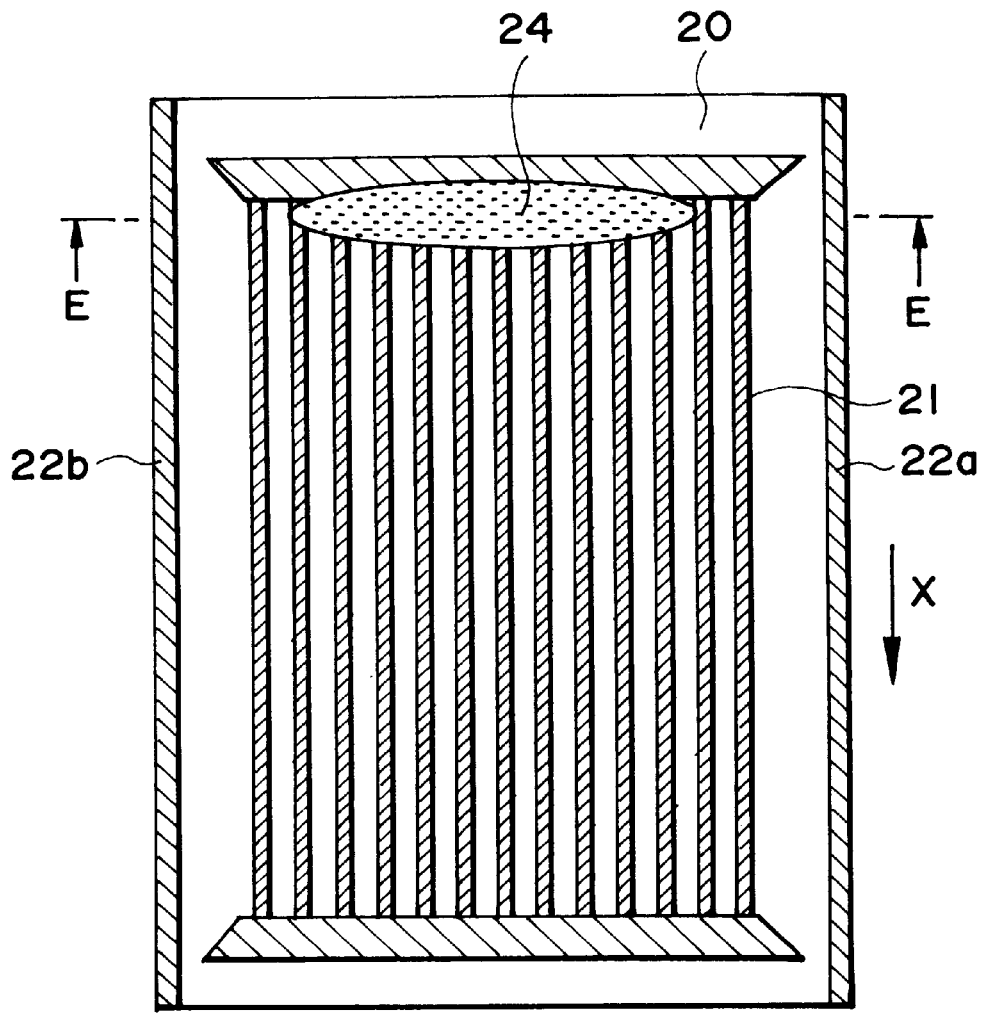
FIG. 17A is a plan view showing a state after placing dropwise a UV-curable resin on a substrate provided with metal electrodes and an elongated projection.

On a 100 mm-square glass substrate 20 of 1 mm in thickness, stripe metal electrodes 21 of Cr were formed each in a width of 10 μm and a thickness of 2 μm and at a pitch of 100 μm and, simultaneously at two side portions in an entire peripheral region of the glass substrate 20, a 2 μm-thick elongated projection comprising elongated portions 22a and 22b opposite and parallel to each other was formed in a width of 5 mm and with a spacing of 10 mm between the elongated portion 22a (22b) and the closest metal electrode (FIG. 17A).

Figure 17B:
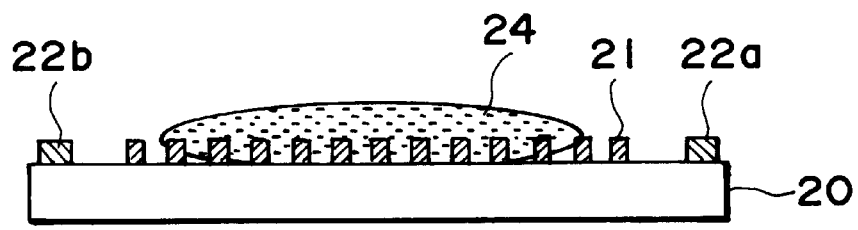
FIG. 17B is a sectional view of the substrate taken along E—E line in FIG. 17A.
Figure 23A:
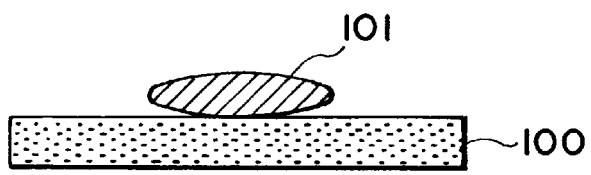
FIG. 23A shows a state of placing a UV-curable resin on a mold plate.
Figure 23B:
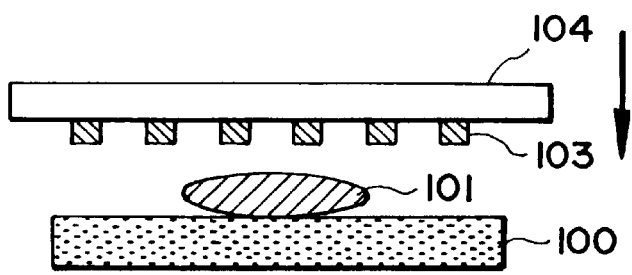
FIG. 23B shows a state before causing the UV-curable resin to contact metal electrodes formed on a substrate.
Figure 23C:
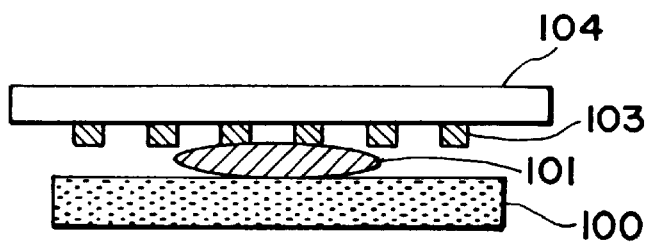
FIG. 23C shows a contact state of the UV-curable resin with metal electrodes.
Figure 24A:
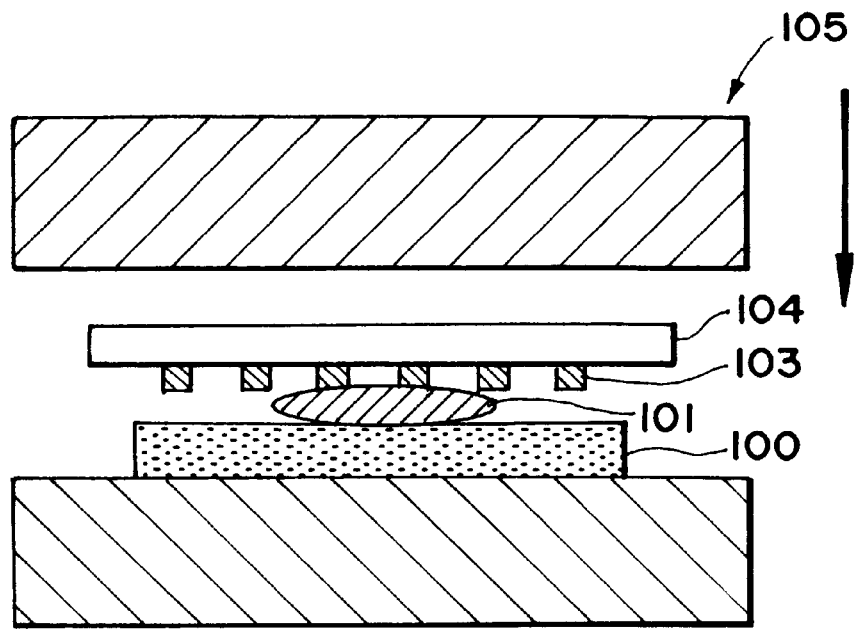
FIG. 24A shows a state before pressing the mold plate and the substrate with a press.
Figure 24B:
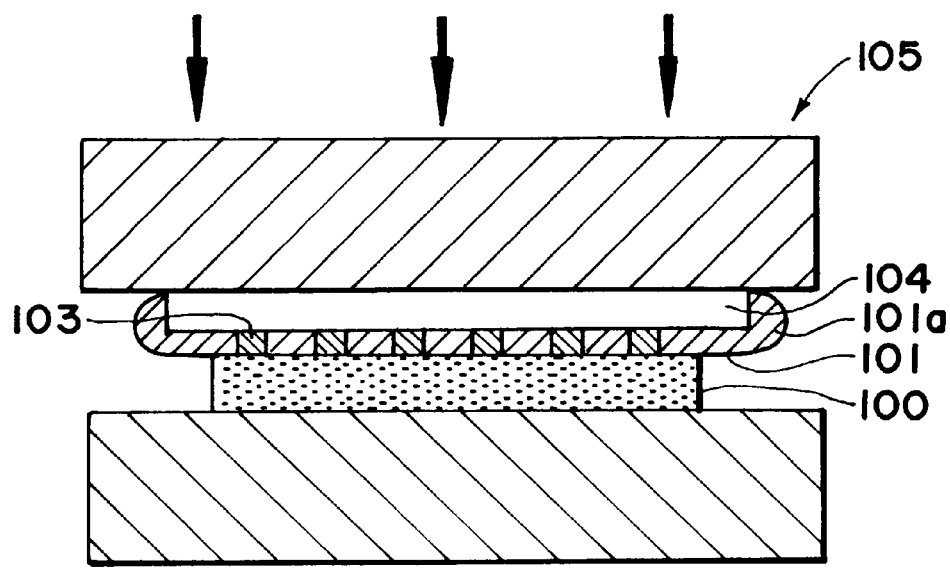
FIG. 24B shows a state of pressing the mold plate and the substrate with the press.
Figure 25A:
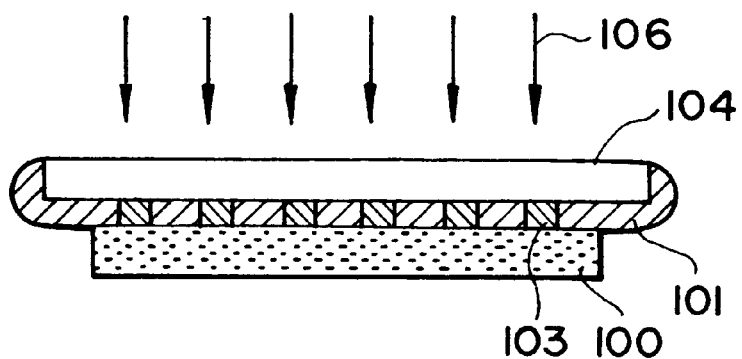
FIG. 25A shows a state of irradiating the UV-curable resin with UV rays.
Figure 25B:
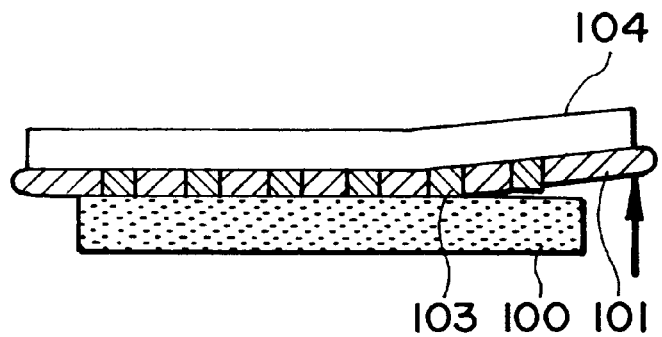
FIG. 25B shows a state of removing the mold plate from the substrate.
Figure 25C:
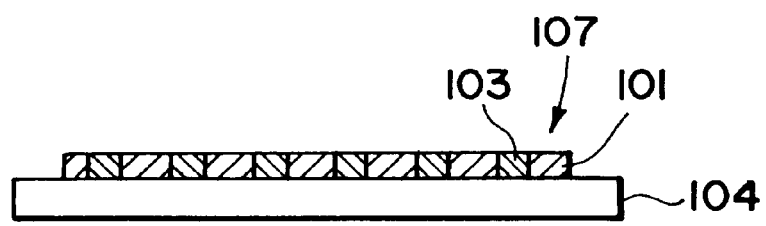
FIG. 25C shows a state of a resultant electrode plate.

After the resultant glass substrate 20 was subjected to an ozone treatment in the same manner as in Example 1, an acrylic UV-curable resin 24 identical to that used in Example 1 was placed dropwise at a prescribed position of the metal electrodes 21 shown in FIG. 17A by using a dispenser (not shown). More specifically, the UV-curable resin 24 was placed dropwise on the glass substrate 20 so that the UV-curable resin placed dropwise provided an elongated shape in a direction perpendicular to a longitudinal direction X of the metal electrodes 21 and was located in one of longitudinal end portions of the metal electrodes (FIGS. 17A and 17B).

Then, a mold plate 25 was applied to the glass substrate 20 and inserted between a pair of rollers of a roller press 26a from the resin-disposing side, followed by feeding of the glass substrate 20 and the mold plate 25 at a certain speed in a direction Y under a pressure of 3 kgw (FIGS. 18A and 18B). As a result, the UV-curable resin 24 uniformly extended over the entire region of the gaps between the metal electrodes 21. Then, the UV-curable resin 24 was irradiated with UV rays (not shown) in the same manner as in Example 1, followed by removal of the mold plate 25 similarly as in Example 1 to obtain an electrode plate 30 (FIGS. 19A and 19B).

According to the electrode plate 30 prepared in this example, the elongated portions 22a and 22b of the elongated projection formed on the glass substrate 20 were effective in preventing the UV-curable resin 24 from flowing out from the sides of the glass substrate 20 since the UV-curable resin 24 was liable to flow or move in a direction perpendicular to the direction X along which the UV-curable resin 24 extended successively in the case of using the roller press 26 providing a certain directionality of pressing.

The resultant electrode plate 30 showed a uniform planarity with respect to the surface formed by the metal electrodes 21 and the UV-cured resin 24 filling the gaps between the metal electrodes 21.

EXAMPLE 3

An electrode plate was prepared in the same manner as in Example 1 except that a 3 μm-thick elongated projection was formed in a width of 10 mm and with a spacing of 8 mm from the closest metal electrode.

The resultant electrode plate different in thickness, width and spacing from the electrode plate 28 prepared in Example 1 also provided a uniform surface formed by embedding the metal electrodes with the UV-cured resin with a good planarity.

EXAMPLE 4

An electrode plate was prepared through a process as illustrated by FIGS. 20A, 20B, 21A and 21B.

On a 100 mm-square glass substrate 20 of 1 mm in thickness, stripe metal electrodes 21 of Al were formed each in a width of 10 μm and a thickness of 2 μm and at a pitch of 100 μm in the same manner as in Example 1. Separately, on a glass-made mold plate 25, a 3 μm-thick elongated projection 22c of Al was formed in a width of 10 mm in an entire peripheral region of the mold plate 25. Thereafter, an acrylic UV-curable resin 24 (identical to that used in Example 1) was placed dropwise on the glass substrate 20, and the mold plate 25 was superposed on the glass substrate 20 so that the elongated projection 22c formed on the mold plate 25 provided a spacing of ca. 10 mm from the closest metal electrode formed on the glass substrate 20 (FIGS. 20A and 20B).

The glass substrate 20 and the mold plate 25 were then pressed by a press, followed by irradiation with UV rays and removal of the mold plate 25 similarly as in Example 1 to obtain an electrode plate 31 (FIGS. 21A and 21B).

The resultant electrode plate 31 was excellent in surface planarity with respect to a surface formed by the metal electrodes 21 and the UV-cured resin 24 in combination since the elongated projection 22c formed in the peripheral region of the mold plate 25 could effectively block the flowing UV-curable resin so as not to flow out from the sides of the glass substrate 20.

EXAMPLE 5

An electrode plate was prepared through a process as illustrated by FIG. 22.

On a 100 mm-square glass substrate 20 of 1 mm in thickness, stripe metal electrodes 21 of Al were formed each in a width of 10 μm and a thickness of 2 μm and at a pitch of 100 μm in the same manner as in Example 1. Separately, a stainless steel-made mold plate 25 provided with a 3 μm-thick and 10 mm-wide elongated projection 25*a* of (of stainless steel) in an entire peripheral region of the mold plate 25 through a cutting process was prepared. Thereafter, an acrylic UV-curable resin 24 (identical to that used in Example 1) was placed dropwise on the glass substrate 20, and the mold plate 25 was superposed on the glass substrate 20 so that the elongated projection 25*a* of mold plate 25 provided a spacing of ca. 10 mm from the closest metal electrode formed on the glass substrate 20.

The glass substrate 20 and the mold plate 25 were then pressed by a press, followed by irradiation with UV rays and removal of the mold plate 25 similarly as in Example 1 except that the UV ray irradiation was performed from the glass substrate side to obtain an electrode plate.

The resultant electrode plate was excellent in surface planarity with respect to a surface formed by the metal electrodes 21 and the UV-cured resin 24 in combination since the elongated projection 25*a* located in the peripheral region of the mold plate 25 could effectively block the flowing UV-curable resin so as not to flow out from the sides of the glass substrate 20.

As described above, according to the present invention, by providing an elongated projection in a peripheral region including four or two side portions of a substrate or mold plate, it becomes possible to prevent a resin (UV-curable resin) from flowing out from the sides of the substrate (and/or the mold plate), thus resulting in a flat (or smooth) surface formed by the resin together with metal electrodes gaps between which are uniformly filled with the resin. Further, in a pressing step of a process for producing the electrode plate, a pressing tool (e.g., a press or a roller press) is not contaminated by the resin, thus improving a production efficiency. In addition, a liquid crystal device of the present invention including such an electrode plate is excellent adhesiveness between the resin and a plurality of transparent electrodes formed on the resin based on a good surface planarity of the resin.

As described above, the process for producing an electrode plate according to the present invention is characterized by a smoothing (flattening) or pressing step wherein a flowable resin is extended over the entire area of gaps between patterned metal electrodes under pressure while suppressing flowing-out of the resin from the sides of a substrate by an elongated projection located in a peripheral region of the substrate or a mold plate to form a flat surface together with the metal electrodes. Accordingly, such a smoothing step adopted in the process of the present invention is also widely applicable to a general step of uniformly filling an open space of a prescribed projection pattern with a flowable component in order to realize a good surface planarity with respect to a resultant surface without causing flowing-out of the flowable component.

What is claimed is:
1. A process for producing an electrode plate comprising the steps of:
    forming on a rectangular substrate a plurality of metal electrodes with gaps therebetween in a prescribed pattern,
    forming a rigid elongated metal projection in a continuous and closed frame shape along all peripheral sides of the substrate, said elongated metal projection having a thickness substantially identical to that of the metal electrodes but having a width larger than that of the metal electrodes,
    placing a resin between the substrate and a mold substrate,
    pressing the mold substrate toward the substrate provided with said elongated metal projection under a pressure sufficient to deform the resin but not deform the elongated metal projection, thereby filling the gaps with the resin while allowing an excess of the resin to flow out of the gaps between the metal electrodes, and
    curing the resin at the gaps between the metal electrodes,
    wherein said elongated metal projection is spaced from the metal electrodes so that a spacing between said elongated metal projection and an outermost metal electrode closest and parallel thereto is wider than a gap between adjacent metal electrodes thereby to fully accommodate the excess of the resin flowing out of the gaps between the metal electrodes within the closed frame of said elongated metal projection and to allow the excess resin to cure.
2. A process according to claim 1, wherein said elongated metal projection has a width of 1–20 mm.
3. A process according to claim 1, wherein said elongated metal projection and the metal electrodes are formed of an identical metal species in a common step so as to provide a substantially identical thickness.
4. A process according to claim 1, wherein the metal electrodes comprises a metal species selected from the group consisting of Cr, Cu, Ag and Al.
5. A process according to claim 1, wherein the resin comprises an ultraviolet-curable resin.
6. A process according to claim 1, wherein the substrate comprises a glass substrate.
7. A process for producing an electrode plate comprising the steps of:
    forming on a substrate a plurality of metal electrodes with gaps therebetween in a prescribed pattern,
    forming a rigid elongated metal projection in a continuous and closed frame along all peripheral sides of a rectangular mold substrate, said elongated metal projection having a thickness substantially identical to that of the metal electrodes but having a width larger than that of the metal electrodes,
    placing a resin between the substrate and the mold substrate,
    pressing the mold substrate provided with said elongated metal projection toward the substrate under a pressure sufficient to deform the resin but not deform said elongated metal projection, thereby filling the gaps with the resin while allowing an excess of the resin to flow out of the gaps between the metal electrodes, and
    curing the resin at the gaps between the metal electrodes,
    wherein said elongated metal projection is spaced from the metal electrodes so that a spacing between said elongated metal projection and an outermost metal electrode closest and parallel thereto is wider than a gap between adjacent metal electrodes thereby to fully accommodate the excess of the resin flowing out of the gaps between the metal electrodes within the closed frame of said elongated metal projection and to allow the resin to cure.

8. A process according to claim 7, wherein said elongated metal projection has a width of 1–20 mm.

9. A process according to claim 7, wherein the metal electrodes comprises a metal species selected from the group consisting of Cr, Cu, Ag and Al.

10. A process according to claim 7, wherein the resin comprises an ultraviolet-curable resin.

11. A process according to claim 7, wherein the substrate comprises a glass substrate.

12. A process for producing a liquid crystal device in which a liquid crystal is disposed between a pair of oppositely disposed plates including at least one electrode plate comprising: a substrate, a plurality of metal electrodes formed with gaps therebetween on the substrate, a resin filling the gaps, and a plurality of transparent electrodes each electrically connected with an associated metal electrode; said process comprising the steps of:

forming on said substrate said plurality of metal electrodes with gaps therebetween in a prescribed pattern, forming an elongated metal projection in a continuous and closed frame along all peripheral sides of a rectangular mold substrate, said elongated metal projection having a thickness substantially identical to that of the metal electrodes but having a width larger than that of the metal electrodes, placing a resin between the substrate and the mold substrate;

pressing the mold substrate provided with said elongated metal projection toward the substrate under a pressure sufficient to deform the resin but not deform said elongated metal projection, thereby filling the gaps with the resin while allowing an excess of the resin to flow out of the gaps between the metal electrodes, and curing the resin at the gaps between the metal electrodes, wherein said elongated metal projection is spaced from the metal electrodes so that a spacing between said elongated metal projection and an outermost metal electrode closest and parallel thereto is wider than a gap between adjacent metal electrodes thereby to fully accommodate the excess of the resin flowing out of the gaps between the metal electrodes within the closed frame of said elongated metal projection and to allow the resin to cure.

13. A process for producing a liquid crystal device in which a liquid crystal is disposed between a pair of oppositely disposed plates including at least one electrode plate comprising: a rectangular substrate, a plurality of metal electrodes formed with gaps therebetween on the substrate, a resin filling the gaps, and a plurality of transparent electrodes each electrically connected with an associated metal electrode; said process comprising the steps of:

forming on a substrate a plurality of metal electrodes with gaps therebetween in a prescribed pattern, forming an elongated metal projection in a continuous and closed frame shape along all peripheral sides of the substrate, said elongated metal projection having a thickness substantially identical to that of the metal electrodes but having a width larger than that of the metal electrodes, placing a resin between the substrate and a mold substrate, pressing the mold substrate toward the substrate provided with said elongated metal projection under a pressure sufficient to deform the resin but not deform the elongated metal projection, thereby filling the gaps with the resin while allowing an excess of the resin to flow out of the gaps between the metal electrodes, and curing the resin at the gaps between the metal electrodes, wherein said elongated metal projection is spaced from the metal electrodes so that a spacing between said elongated metal projection and an outermost metal electrode closest and parallel thereto is wider than a gap between adjacent metal electrodes thereby to fully accommodate the excess of the resin flowing out of the gaps between the metal electrodes within the closed frame of said elongated metal projection and to allow the excess resin to cure.

14. A process according to claim 13, wherein the steps of forming the metal electrodes in a prescribed pattern and the step of forming said elongated metal projection are performed at the same time.

15. A process according to claim 13, further comprising a step of cutting a portion of the substrate including said elongated metal projection after the step of filling the gaps with the resin.

* * * * *

UNITED STATES PATENT AND TRADEMARK OFFICE
CERTIFICATE OF CORRECTION

PATENT NO. : 6,388,728 B1
DATED : May 14, 2002
INVENTOR(S) : Hiroyuki Tokunaga et al.

It is certified that error appears in the above-identified patent and that said Letters Patent is hereby corrected as shown below:

Column 2,
Line 4, "100.is" should read -- 100 is --.

Column 3,
Line 10, "having an" should be deleted;
Line 11, "electrode plates" should be deleted; and
Line 14, "substrate,:and" should read -- substrate, and --.

Column 5,
Line 8, "plate" should read -- plate, --.

Column 6,
Line 43, "provide" should read -- provided --; and
Line 52, "extended. In this case," should read -- extended, --.

Column 7,
Line 20, "sides:of" should read -- sides of --; and
Line 46, "be comprises" should read -- comprise --.

Column 11,
Line 48, "is" should read -- shows --.

Column 12,
Line 17, "not" should read -- not to --; and
Line 38, "comprises" should read -- comprise --.

UNITED STATES PATENT AND TRADEMARK OFFICE
CERTIFICATE OF CORRECTION

PATENT NO.     : 6,388,728 B1
DATED          : May 14, 2002
INVENTOR(S)    : Hiroyuki Tokunaga et al.

It is certified that error appears in the above-identified patent and that said Letters Patent is hereby corrected as shown below:

<u>Column 13,</u>
Line 9, "comprises" should read -- comprise --.

Signed and Sealed this

Twenty-sixth Day of November, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO.   : 6,388,728 B1  
DATED        : May 14, 2002  
INVENTOR(S)  : Hiroyuki Tokunaga et al.

It is certified that error appears in the above-identified patent and that said Letters Patent is hereby corrected as shown below:

<u>Title page,</u>
Item [56], U.S. PATENT DOCUMENTS, add
-- 4714636   12/1987   Yokono et al.      428/1
   4744637   5/1988    Sekimura et al.    350/339R
   4802743   2/1989    Takao et al.       350/339F
   4917471   4/1990    Takao et al.       350/399F
   5101289   3/1992    Takao et al.       359/68
   5410423   4/1995    Furushima et al.   359/80 --
Item [56], FOREIGN PATENT DOCUMENTS, add
 -- JP   02063019   3/1990    Japan
    JP   06347810   12/1994   Japan
    JP   08304842   11/1996   Japan --

Signed and Sealed this

Eighteenth Day of February, 2003

JAMES E. ROGAN  
*Director of the United States Patent and Trademark Office*